(12) United States Patent
Long et al.

(10) Patent No.: US 11,378,848 B2
(45) Date of Patent: Jul. 5, 2022

(54) PIXEL STRUCTURE AND MANUFACTURING METHOD THEREOF, ARRAY SUBSTRATE AND DISPLAY DEVICE

(71) Applicant: BOE TECHNOLOGY GROUP CO., LTD., Beijing (CN)

(72) Inventors: Chunping Long, Beijing (CN); Hui Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 466 days.

(21) Appl. No.: 16/343,037

(22) PCT Filed: Sep. 29, 2018

(86) PCT No.: PCT/CN2018/108728
§ 371 (c)(1),
(2) Date: Apr. 18, 2019

(87) PCT Pub. No.: WO2019/137044
PCT Pub. Date: Jul. 18, 2019

(65) Prior Publication Data
US 2021/0333658 A1    Oct. 28, 2021

(30) Foreign Application Priority Data
Jan. 15, 2018 (CN) .......................... 201820061780.4

(51) Int. Cl.
*H01L 51/52* (2006.01)
*G02F 1/1362* (2006.01)
(Continued)

(52) U.S. Cl.
CPC .... *G02F 1/134363* (2013.01); *H01L 51/5209* (2013.01); *G02F 1/1368* (2013.01); *G02F 1/136227* (2013.01)

(58) Field of Classification Search
CPC .......... H01L 51/5209; G02F 1/134363; G02F 1/1368; G02F 1/134309
See application file for complete search history.

(56) References Cited

U.S. PATENT DOCUMENTS 10,732,474 B2 *  8/2020  Lee .................... G02F 1/1368
10,768,486 B2 *  9/2020  Lee .................. G02F 1/133753
(Continued)

FOREIGN PATENT DOCUMENTS

CN    101625487 A    1/2010
CN    102193256 A    9/2011
(Continued)

OTHER PUBLICATIONS

International Search Report and Written Opinion in corresponding International Patent Application No. PCT/CN2018/108728 dated Jan. 7, 2019. 17 pages.
(Continued)

*Primary Examiner* — David Vu
*Assistant Examiner* — Brandon C Fox
(74) *Attorney, Agent, or Firm* — Leason Ellis LLP

(57) ABSTRACT

A pixel structure and a manufacturing method thereof, an array substrate and a display device are provided. The pixel structure includes a first electrode having a first groove group, a second groove group and a non-hollow portion; the first groove group includes a plurality of hollow first grooves arranged successively, each first groove includes a first end and a second end arranged along an extending direction thereof; the second groove group includes a plurality of hollow second grooves arranged successively, each second groove includes a third end and a fourth end arranged along an extending direction thereof, and a third end is on a side of the fourth end adjacent to the first groove group; and the third end of at least one second groove is staggered with
(Continued)

respect to the second end of the first groove adjacent to the third end.

19 Claims, 3 Drawing Sheets

(51) Int. Cl.
    *G02F 1/1368*     (2006.01)
    *G02F 1/1343*     (2006.01)

(56) References Cited

U.S. PATENT DOCUMENTS

| | | | | |
|---|---|---|---|---|
| 2008/0259263 | A1* | 10/2008 | Cho | G02F 1/133707 349/142 |
| 2012/0138963 | A1 | 6/2012 | Tseng et al. | |
| 2013/0286332 | A1* | 10/2013 | Inoue | G02F 1/133514 349/106 |
| 2014/0092353 | A1 | 4/2014 | Matsushima | |
| 2015/0131037 | A1* | 5/2015 | Kim | G02F 1/133528 349/96 |
| 2016/0077387 | A1* | 3/2016 | Woo | G02F 1/134336 349/123 |
| 2016/0147119 | A1* | 5/2016 | Chang | G09G 3/3648 349/33 |
| 2016/0377933 | A1 | 12/2016 | Oh et al. | |
| 2017/0045773 | A1* | 2/2017 | Seo | G02F 1/136209 |
| 2017/0212623 | A1* | 7/2017 | Park | G02F 1/1368 |

FOREIGN PATENT DOCUMENTS

| | | |
|---|---|---|
| CN | 202221503 U | 5/2012 |
| CN | 104808399 A | 7/2015 |
| CN | 104375340 B | 4/2017 |
| CN | 207780441 U | 8/2018 |

OTHER PUBLICATIONS

Extended European Search Report for corresponding European Application No. 18867303.2, dated Oct. 21, 2021. 9 pages.

* cited by examiner

PIXEL STRUCTURE AND MANUFACTURING METHOD THEREOF, ARRAY SUBSTRATE AND DISPLAY DEVICE

CROSS-REFERENCE TO RELATED APPLICATIONS

This application is a U.S. National Stage Application under 35 U.S.C. § 371 of International Patent Application No. PCT/CN2018/108728, filed Sep. 29, 2018, which claims the benefit of Chinese patent application No. 201820061780.4 filed on Jan. 15, 2018, both of which are incorporated by reference in their entireties as a part of the present application.

TECHNICAL FIELD

Embodiments of the present disclosure relate to a pixel structure, an array substrate and a display device.

BACKGROUND

Liquid crystal display devices have been widely used in consumer electronic products such as mobile phones, notebook computers, personal computers, and personal digital assistants. The liquid crystal display device includes an array substrate, the array substrate includes a plurality of gate lines, a plurality of data lines, and a plurality of pixel units electrically connected to corresponding gate lines and corresponding data lines, and each of the pixel units individually controls the transmittance of backlight, to achieve display.

However, the liquid crystal display devices generally have a narrow viewing angle defect. With the development of display technology, people pay more and more attention to the viewing angle characteristics of the liquid crystal display devices, and wide viewing angle technology has become one of research hotspots.

SUMMARY

Embodiments of the present disclosure provide a pixel structure, a manufacturing method of the pixel structure, an array substrate and a display device. The embodiments of the present disclosure may enable a liquid crystal display device to have a wider viewing angle.

At least one embodiment of the present disclosure provides a pixel structure including a first electrode, and the first electrode includes a first groove group, a second groove group and a non-hollow portion adjacent to both the first groove group and the second groove group; the first groove group includes a plurality of first grooves which are hollow and are successively arranged, each first groove includes a first end and a second end which are arranged along an extending direction of the first groove, first ends of the plurality of first grooves are on a first side of the first groove group, second ends of the plurality of first grooves are on a second side of the first groove group, and the second side and the first side are opposite to each other; the second groove group is on the second side of the first groove group and includes a plurality of second grooves which are hollow and are successively arranged, each second groove includes a third end and a fourth end which are arranged along an extending direction of the second groove, and the third end is on a side of the fourth end close to the first groove group; and the third end of at least one of the plurality of second grooves is staggered with respect to the second end of the first groove which is adjacent to the third end of the at least one of the plurality of second grooves.

For example, the plurality of first grooves and the plurality of second grooves are alternately arranged.

For example, for the first groove and the second groove which are adjacent to each other, the second end of the first groove is between the third end and the fourth end of the second groove in an arrangement direction of the first groove group and the second groove group.

For example, a number of the plurality of first grooves is not equal to a number of the plurality of second grooves.

For example, the pixel structure further includes a second electrode, the second electrode and the first electrode are in different layers, one of the first electrode and the second electrode is a pixel electrode and the other of the first electrode and the second electrode is a common electrode.

For example, the pixel structure further includes a first signal line extending in a first direction; a second signal line extending in a second direction and intersecting the first signal line, wherein one of the first signal line and the second signal line is a gate line and the other of the first signal line and the second signal line is a data line.

For example, an inclination angle of the first groove with respect to the first signal line is not equal to an inclination angle of the second groove with respect to the first signal line.

For example, an inclination direction of the first groove with respect to the first signal line is opposite to an inclination direction of the second groove with respect to the first signal line.

For example, the pixel structure further includes a transistor which is at an intersection of the first signal line and the second signal line and is electrically connected with the first electrode, the second groove group is between the first groove group and the first signal line, and the second groove which is included by the plurality of second grooves and is closest to the transistor has a smallest extension length among extension lengths of the plurality of second grooves.

For example, the plurality of second grooves are staggered with respect to the plurality of first grooves in a direction away from the transistor.

For example, the first electrode includes a first edge and a second edge which are intersected with each other and arranged along the second direction, the first edge is parallel to the first groove, and the second edge is parallel to the second groove.

For example, the second signal line includes a first extension portion and a second extension portion which are intersected with each other and arranged along the second direction, the first extension portion is parallel to the first edge, and the second extension portion is parallel to the second edge.

For example, the non-hollow portion includes first extension portions which are strip-shaped and respectively located between the plurality of first grooves, and further includes second extension portions which are strip-shaped and respectively located between the plurality of second grooves, each first extension portion corresponds to one second groove and each second extension portion corresponds to one first groove.

For example, an extension length of each first extension portion is less than or equal to an extension length of the first groove adjacent to the first extension portion, and an extension length of each second extension portion is less than or equal to an extension length of the second groove adjacent to the second extension portion.

For example, a width of the first extension portion is substantially equal to a width of the second extension portion.

For example, the first electrode further includes a third groove group and a fourth groove group, the third groove group includes a plurality of third grooves which are hollow and are successively arranged, and the fourth groove group includes a plurality of fourth grooves which are hollow and are successively arranged; an arrangement direction of the third groove group and the fourth groove group intersects an arrangement direction of the first groove group and the second groove group.

For example, at least one third groove is staggered in the second direction with respect to the fourth groove adjacent to the at least one third groove.

For example, the plurality of first grooves and the plurality of second grooves are closed grooves surrounded by the non-hollowed portion; or the first electrode further includes a fifth groove which is between the first groove group and the second groove group in an arrangement direction of the first groove group and the second groove group, and the fifth groove opens into the second ends of the first grooves and opens into the third ends of the second grooves.

For example, the plurality of first grooves and the plurality of second grooves have an equal width in the first direction.

For example, a distance by which each second groove is staggered in the first direction with respect to the first groove adjacent to the second groove is equal to a width of the second end of the first groove in the first direction.

For example, at least part of the plurality of second grooves have unequal extension lengths.

At least one embodiment of the present disclosure provides an array substrate including the pixel structure in any one of the above embodiments.

At least one embodiment of the present disclosure provides a display device including the array substrate described above.

At least one embodiment of the present disclosure provides a manufacturing method of a pixel structure, and the method includes forming a first electrode, so that the first electrode includes a first groove group, a second groove group, and a non-hollow portion adjacent to both the first groove group and the second groove group; the first groove group includes a plurality of first grooves which are hollow and are successively arranged, each first groove includes a first end and a second end which are arranged along an extending direction of each first groove, first ends of the plurality of first grooves are on a first side of the first groove group, second ends of the plurality of first grooves are on a second side of the first groove group, and the second side is opposite to the first side; the second groove group is on the second side of the first groove group and includes a plurality of second grooves which are hollow and are successively arranged, each second groove includes a third end and a fourth end which are arranged along an extending direction of each second groove, and the third end is on a side of the fourth end close to the first groove group; and the third end of at least one of the plurality of second grooves is staggered with respect to the second end of the first groove adjacent to the third end of at least one of the plurality of second grooves.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
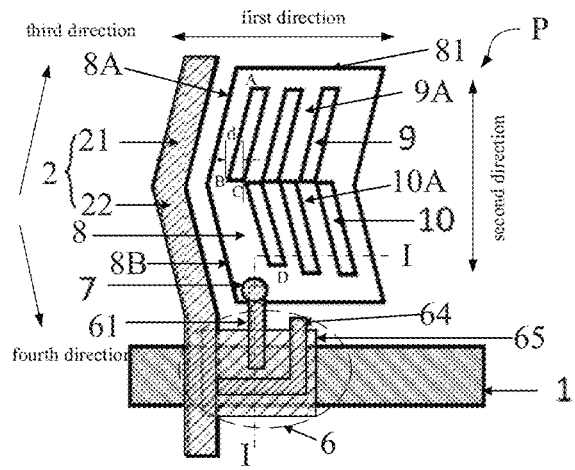
FIG. 1A is a schematic top view of a pixel structure provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Embodiments of the present disclosure provide a pixel structure, a manufacturing method of the pixel structure, an array substrate and a display device. A first electrode in the pixel structure includes a first groove group, a second groove group and a non-hollow portion adjacent to the first groove group and the second groove group, the first groove group includes a plurality of first grooves which are hollow and are successively arranged, each first groove includes a first end and a second end which are arranged along an extending direction of each first groove, first ends of the plurality of first grooves are on a first side of the first groove group, second ends of the plurality of first grooves are on a second side of the first groove group, and the second side and the first side are opposite to each other; the second groove group is on the second side of the first groove group and includes a plurality of second grooves which are hollow and are successively arranged, each second groove includes a third end and a fourth end which are arranged along an extending direction of each second groove, and the third end is on a side of the fourth end close to the first groove group; and the third end of at least one of the plurality of second grooves is staggered with respect to the second end of the first groove which is adjacent to the third end of the at least one of the plurality of second grooves. In the embodiments of the present disclosure, the first grooves and the second grooves which have intersected extending directions are provided in the first electrode of the pixel structure, and the at least one second groove is staggered with respect to the first groove adjacent to the at least one second groove, which causes liquid crystal molecules in a liquid crystal display device to have more deflection angles, thereby improving the wide viewing angle characteristics of the liquid crystal display device.

For example, the first electrode is a pixel electrode or a common electrode.

For example, the first electrode is a transparent electrode which is formed of, for example, ITO (indium tin oxide), IZO (indium zinc oxide), IGZO (indium gallium zinc oxide) or a similar transparent conductive material. In this case, the pixel structure provided by the embodiments of the present disclosure is, for example, a transmissive pixel structure, and correspondingly, the liquid crystal display device to which the pixel structure is applied is a transmissive liquid crystal display device.

For example, the first electrode is a metal electrode formed of, for example, a metal material such as aluminum, aluminum alloy, copper, molybdenum, zirconium or titanium. In this case, the pixel structure provided by the embodiment of the present disclosure is, for example, a reflective pixel structure. Accordingly, the liquid crystal display device to which the pixel structure is applied is a reflective liquid crystal display device.

In the embodiments of the present disclosure, for each second groove among the at least one second groove, the third end of the second groove is staggered with respect to the second end of the first groove adjacent to the third end, so the third end of the second groove and the second end of the first groove (i.e., ends that are respectively included by the second groove and the first groove and are adjacent to each other) are not completely aligned, that is, the third end of the second groove corresponds to at least a portion of the non-hollow portion, and the portion of the non-hollow portion is adjacent to the first groove and extends along the first groove. By make the at least one second groove staggered with respect to the first groove adjacent to the at least one second groove, the plurality of first grooves and the plurality of second grooves in the first electrode form a non-axisymmetric structure, which is advantageous for making the liquid crystal molecules to have more deflection angles, and thus is advantageous for improving the wide viewing angle characteristics of the liquid crystal display device.

For example, the plurality of first grooves included by the first groove group are arranged along a first direction, and the plurality of second grooves included by the second groove group are also arranged along the first direction. The first groove group and the second groove group are arranged along a second direction different from the first direction, and the third end of the at least one second groove is staggered along the first direction with respect to the second end of the first groove adjacent to the third end.

The first direction is different from the second direction, i.e. the first direction intersects the second direction. For example, the first direction is perpendicular to the second direction. Embodiments regarding the angle between the first direction and the second direction include, but are not limited to, a right angle.

The pixel structure, the array substrate and the display device in the embodiments of the present disclosure are described in detail below with reference to the accompanying drawings. The following embodiments are only examples and are not limitative.

For example, as illustrated in FIG. 1A and FIG. 2 to FIG. 6, the pixel structure provided by the embodiments of the present disclosure includes the first electrode 81 located in a pixel unit P, the first electrode 81 includes the first groove group, the second groove group, and the non-hollow portion 8 (a portion that is included by the first electrode 81 and is outside the first groove group and the second groove group is the non-hollow portion); the first groove group includes the plurality of hollow first grooves 9 arranged successively, each first groove 9 includes the first end A and the second end B which are arranged along the extending direction of the first groove 9, the first ends A of the plurality of first grooves 9 are located on the first side of the first groove group (for example, an upper side of the first groove group in the figures), and the second ends B of the plurality of first grooves 9 are located on the second side of the first groove group (for example, a lower side of the first groove group in the figures), and the second side is opposite to the first side; the second groove group is located on the second side of the first groove group and includes the plurality of hollow second grooves 10 arranged successively, each second groove 10 includes the third end C and the fourth end D which are arranged along the extending direction of the second groove 10, the third end C is located on a side of the fourth end D close to the first groove group (an upper side of the fourth end D in the figures); and the third end C of the at least one second groove 10 is staggered with respect to the second end B of the first groove 9 adjacent to the third end C (e.g., staggered along the first direction).

It should be noted that the embodiments illustrated in FIG. 1A and FIG. 2 to FIG. 6 are merely illustrative, and the upper side and the lower side in the figures vary with the change of a viewing angle.

For example, as illustrated in FIG. 1A and FIG. 2 to FIG. 6, at least one embodiment of the present disclosure provides a pixel structure including the pixel unit P, and the first electrode 81 in the pixel unit P includes the non-hollow portion 8, the plurality of hollow first grooves 9 and the plurality of hollow second grooves 10. The plurality of first grooves 9 are successively arranged along the first direction (for example, along a horizontal direction) and incline with respect to the first direction, the plurality of second grooves 10 are also successively arranged along the first direction and incline with respect to the first direction, the first groove group in which the plurality of first grooves 9 are located and the second groove group in which the plurality of second grooves 10 are located are arranged along the second direction (for example, along a vertical direction), and each second groove 10 among the plurality of second grooves 10 is staggered along the first direction with respect to the first groove 9 adjacent to the second groove 10. The second end B of the first groove 9 is directed to the first end A of the first groove 9 along a third direction, and the third end C of the second groove 10 is directed to the fourth end D of the second groove 10 along a fourth direction.

For example, as illustrated in FIGS. 1A, 2, 3, 5 and 6, the first grooves 9 and the second grooves 10 are alternately arranged. For example, the first grooves 9 and the second grooves 10 are alternately arranged along the first direction. That is, the non-hollow portion 8 includes strip-shaped first extension portions 9A respectively located between the plurality of first grooves 9, and further includes strip-shaped second extension portions 10A respectively located between the plurality of second grooves 10, each first extension portion 9A corresponds to one second groove 10 and each second extension portion 10A corresponds to one first groove 9. By alternately arranging the first grooves 9 and the second grooves 10, it is possible to realize that each second groove 10 among the plurality of second grooves 10 is staggered along the first direction with respect to the first groove 9 adjacent to the each second groove 10.

For example, a distance by which each second groove 10 is staggered in the first direction with respect to the first groove 9 adjacent to the each second groove 10 is substantially equal to a width of the second end B of the first groove 9 in the first direction, and a staggered distance d is illustrated in FIG. 1A. This makes the arrangement of the first grooves 9 and the second grooves 10 relatively compact to provide more first grooves 9 and more second grooves 10, thereby facilitating the improvement of the wide viewing angle characteristics and the increase of an aperture ratio. On the basis of this, for example, a width of the end (i.e., the second end B) of each second groove 10 in the first direction is substantially equal to a width of the end (i.e., the third end C) of the first extension portion 9A being close to and in correspondence with the each second groove 10 (that is, the distance by which each first groove 9 is staggered in the first direction with respect to the second groove 10 adjacent to the each first groove 9 is substantially equal to the width of the third end C of the second groove 10 in the first direction), such that it is advantageous to provide more first grooves 9 and more second grooves 10 in the first electrode 81.

In order to provide more first grooves 9 and more second grooves 10 in the first electrode 81, for example, as illustrated in FIG. 1A and FIG. 2 to FIG. 6, the first electrode 81 includes a first edge 8A and a second edge 8B (not marked in FIGS. 2 to 6) which are arranged along the second direction and intersected with each other, the first edge 8A is parallel to the first groove 9, and the second edge 8B is parallel to the second groove 10, so that a side edge of the first electrode 81 form a bent structure by the first edge 8A and the second edge 8B.

For example, as illustrated in FIG. 1A and FIG. 2 to FIG. 6, the pixel structure further includes: a first signal line 1 extending along the first direction; and a second signal line 2 extending along the second direction and intersecting the first signal line 1. One of the first signal line 1 and the second signal line 2 is a gate line and the other is a data line. In the embodiments illustrated in FIG. 1A and FIG. 2 to FIG. 6, the first signal line 1 is the gate line and the second signal line 2 is the data line, such that the first grooves 9 as well as the second grooves 10 are arranged along the gate line and extend substantially along the data line, which helps to simplify pixel design. In other embodiments of the present disclosure, for example, the first signal line 1 is the data line and the second signal line 2 is the gate line.

For example, the pixel structure includes a plurality of first signal lines 1 and a plurality of second signal lines 2, and a region defined by adjacent first signal lines 1 intersecting adjacent second signal lines 2 is a region where the pixel unit P is located.

For example, the first signal line 1 and the second signal line 2 are formed of a metal material such as aluminum, aluminum alloy, copper, molybdenum, zirconium or titanium or the like.

On the basis of the side edge of the first electrode 81 being bent, for example, as illustrated in FIG. 1A and FIG. 2 to FIG. 6, the second signal line 2 includes a first extension portion 21 and a second extension portion 22 (not marked in FIGS. 3 to 6) which are arranged along the second direction and intersected with each other, the first extension portion 21 is substantially parallel to the first edge 8A, and the second extension portion 22 is substantially parallel to the second edge 8B, whereby the second signal line 2 also form a bent structure substantially parallel to the side edge of the first electrode 81. This is advantageous in making the pixel structure more compact.

For example, on the basis that the second signal line 2 includes the first extension portion 21 and the second extension portion 22, the second signal line 2 further includes a third extension portion perpendicular to the first signal line 1, and the first extension portion 21, the second extension portion 22 and the third extension portion are successively arranged along the second direction.

For example, in any one of the above embodiments, the first electrode 81 is the pixel electrode or the common electrode.

Figure 1B:
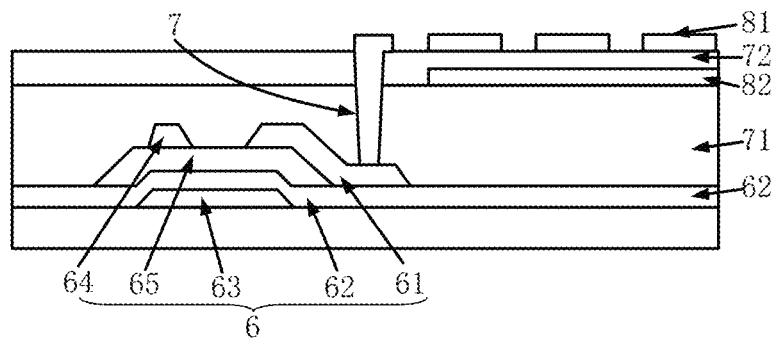
FIG. 1B is a schematic cross-sectional view taken along line I-I of FIG. 1A.

For example, as illustrated in FIG. 1B, the pixel structure further includes a second electrode 82, the second electrode 82 and the first electrode 81 are located in different layers, and one of the first electrode 81 and the second electrode 82 is the pixel electrode and the other is the common electrode. By arranging the pixel electrode and the common electrode in different layers, it is advantageous to make the liquid crystal molecules have more deflection angles, thereby facilitating the improvement of the wide viewing angle characteristics.

For example, the second electrode 82 is formed of the same material as the first electrode 81 as described above, and repeated descriptions will be omitted herein.

For example, as illustrated in FIG. 1A and FIG. 2 to FIG. 6, the pixel structure further includes a transistor 6 located at an intersection of the first signal line 1 and the second signal line 2 and electrically connected with the first electrode 81 (for example, the transistor 6 is electrically connected with the first electrode 81 through a via hole 7). In this case, the first electrode 81 is the pixel electrode.

For example, as illustrated in FIGS. 1A and 1B, the transistor 6 includes a gate electrode 63, a gate insulating layer 62, an active layer 65, and a source electrode 64/a drain electrode 61, which are successively disposed on a base substrate (not marked in FIG. 1B). For example, a portion that is included by the gate line (one example of the first signal line 1) and is corresponding to the active layer 65 serves as the gate electrode. For example, the source electrode 64 is directly connected with the data line (one example of the second signal line 2, for example, the source electrode 64 and the data line 2 are formed together in a one-piece manner). For example, the pixel electrode (one example of the first electrode 81) is electrically connected with the drain electrode 61 of the transistor 6 through the via hole 7 penetrating through insulating layers. For example, the via hole 7 penetrates through a planarization insulating layer 71 and a passivation insulating layer 72. The structure of the transistor 6 and its connection relationship with the first signal line 1, the second signal line 2 and the first electrode 81 in the embodiments of the present disclosure include, but are not limited to, the embodiments illustrated in FIGS. 1A and 1B.

For example, the gate electrode 63, the source electrode 64 and the drain electrode 61 are formed of a metal material such as aluminum, aluminum alloy, copper, molybdenum, zirconium or titanium or the like.

For example, the active layer 65 is formed of a semiconductor material such as amorphous silicon, polycrystalline silicon, or an oxide semiconductor or the like.

For example, both the gate insulating layer 62 and the passivation insulating layer 72 are an inorganic insulating layer, an organic insulating layer, or a lamination layer of the inorganic insulating layer and the organic insulating layer. For example, the planarization insulating layer 71 is an organic insulating layer.

Figure 2:
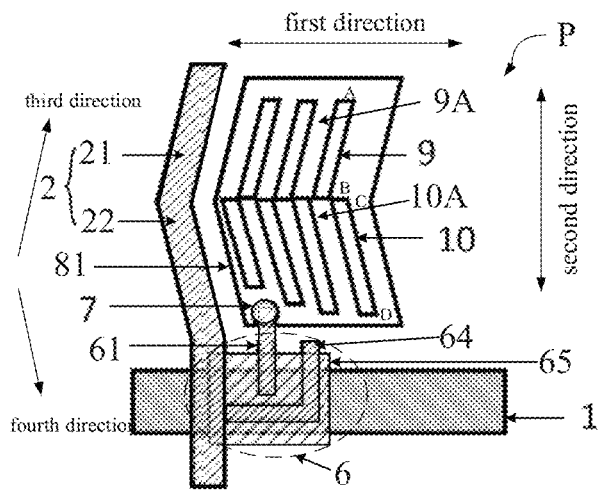
FIG. 2 is a schematic top view of the pixel structure provided by another embodiment of the present disclosure.
Figure 6:
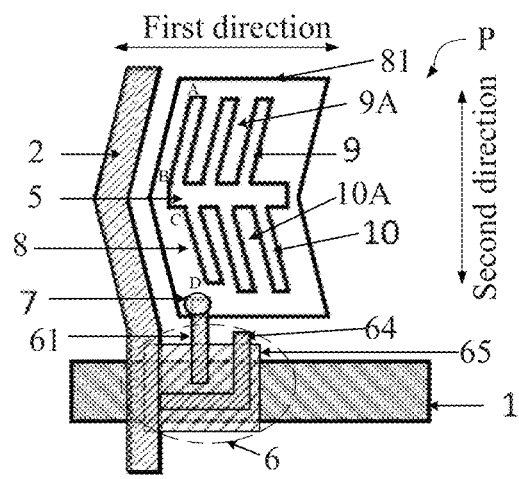
FIG. 6 is a schematic top view of the pixel structure provided by another embodiment of the present disclosure.

For example, as illustrated in FIG. 1A, FIG. 2 and FIG. 6, the first groove group in which the plurality of second grooves 10 are located is located between the first signal line 1 and the second groove group in which the plurality of first grooves 9 are located, and the second groove 10 which is included by the plurality of second grooves 10 and is closest to the transistor 6 has a smallest extension length among extension lengths of the plurality of second grooves 10. By making the second groove 10 close to an electrical connection position (for example, a position of the via hole 7) where the first electrode 81 is electrically connected with the transistor 6 have a smaller extension length, it is advantageous to prevent the second groove 10 from overlapping the electrical connection position, thus, it is advantageous to avoid connection failure between the first electrode 81 and the transistor 6.

Figure 3:
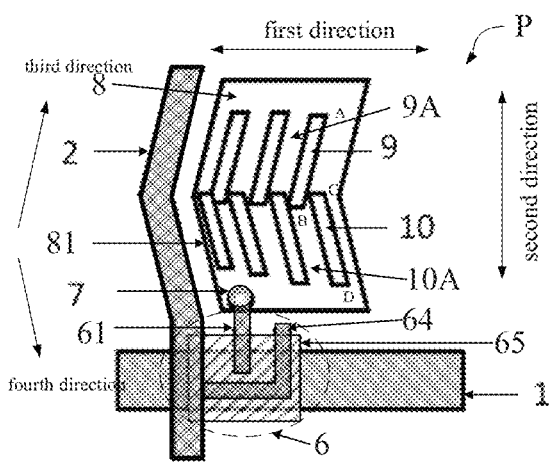
FIG. 3 is a schematic top view of the pixel structure provided by yet another embodiment of the present disclosure.
Figure 4:
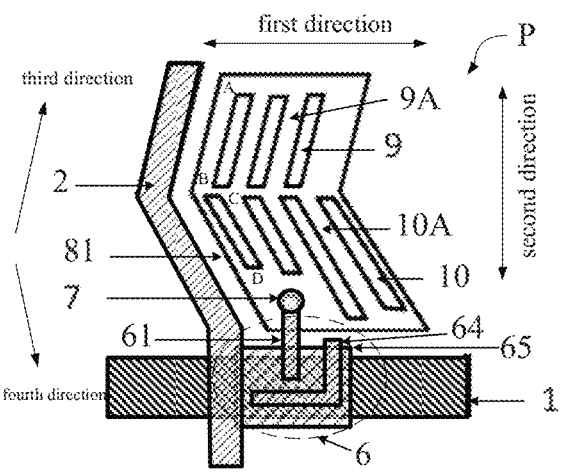
FIG. 4 is a schematic top view of the pixel structure provided by still another embodiment of the present disclosure.

For example, as illustrated in FIG. 1A and FIG. 2 to FIG. 6, at least part of the second grooves 10 have unequal extension lengths. For example, as illustrated in FIGS. 3 and 4, the extension lengths of at least four second grooves 10 are not equal to one another. By making the extension lengths of at least part of the second grooves 10 unequal to one another, the non-axisymmetric property of the plurality of first grooves 9 and the plurality of second grooves 10 can be further improved. In other embodiments, for example, the extension lengths of the second grooves 10 are equal to one another.

For example, as illustrated in FIGS. 1A and 6, the plurality of second grooves 10 are staggered with respect to the plurality of first grooves 9 in a direction away from the transistor 6. This further facilitates preventing the second groove 10 from overlapping the electrical connection position where the first electrode 81 is electrically connected with the transistor 6, thereby facilitating avoidance of poor connection between the first electrode 81 and the transistor 6.

For example, as illustrated in FIGS. 1A and 6, the number of the first grooves 9 is equal to the number of the second grooves 10. Alternatively, for example, as illustrated in FIGS. 2 to 5, the number of the first grooves 9 is not equal to the number of the second grooves 10. By making the number of the first grooves 9 and the number of the second grooves 10 unequal, it is more advantageous to form a non-axisymmetric structure by the first grooves 9 and the second grooves 10 to improve the wide viewing angle characteristics.

For example, as illustrated in FIGS. 1A and 2, an extension length of the first extension portion 9A (i.e., a length along the extending direction of the first extension portion 9A) included by the non-hollow portion 8 is substantially equal to an extension length of the first groove 9 adjacent to the first extension portion 9A, and the second extension portion 10A included by the hollow portion 8 has an extension length substantially equal to an extension length of the second groove 10 adjacent to the second extension portion 10A. This arrangement allows the adjacent ends of the plurality of first grooves 9 and the plurality of second grooves 10 substantially in a same straight line.

For a normally black mode liquid crystal display device, a boundary of domains tends to be dark. In this regard, for example, as illustrated in FIG. 3, for the first groove 9 and the second groove 10 adjacent to each other, the second end B of the first groove 9 is located between the third end C and the fourth end D of the second groove 10 in the arrangement direction (the second direction in FIG. 3) of the first groove group and the second groove group. In this case, the extension length of the first extension portion 9A is smaller than the extension length of the first groove 9 adjacent to the first extension portion 9A, and the extension length of the second extension portion 10A is smaller than the extension length of the second groove 10 adjacent to the second extension portion 10A. This makes a boundary between a domain in which the plurality of first grooves 9 are located and a domain in which the plurality of second grooves 10 are located being curved, so that the phenomenon of darkening at the boundary of the domains can be avoided or inhabited, to improve the display effect.

For example, as illustrated in FIG. 1A, FIG. 2, FIG. 3 and FIG. 6, in the first electrode 81, a width of the plurality of first grooves 9 in the first direction is substantially equal to a width of the plurality of second grooves 10 in the first direction, which is advantageous for increasing the viewing angle uniformity of the liquid crystal display device. On the basis of this, for example, as illustrated in FIG. 1A, FIG. 2 and FIG. 6, the non-hollow portion 8 of the first electrode 81 includes the first extension portion 9A and the second extension portion 10A which have substantially the same width in the first direction (That is, a distance between adjacent first grooves 9 in the first direction is substantially equal to a distance between adjacent second grooves 10 in the first direction), which is further advantageous for increasing the viewing angle uniformity of the liquid crystal display device. In other embodiments, the widths of the first groove 9 and the second groove 10 in the first direction may be unequal to each other, or the widths of the first extension portion 9A and the second extension portion 9B may be unequal to each other.

For example, as illustrated in FIGS. 1A, 2, 3, 5 and 6, inclination angles of the first groove 9 and the second groove 10 with respect to the first direction are substantially equal to each other. Alternatively, for example, as illustrated in FIG. 4, the inclination angle of the first groove 9 with respect to the first direction is not equal to the inclination angle of the second groove 10 with respect to the first direction, so that wide viewing angle characteristics in different directions can be realized by the first grooves 9 and the second grooves 10.

For example, as illustrated in FIG. 4, the inclination angles of the first grooves 9 with respect to the first direction are greater than the inclination angles of the second grooves 10 with respect to the first direction, so that the first grooves 9 have a better effect of improving the wide viewing angle characteristic in the first direction, and the second grooves 10 have a better effect of improving the wide viewing angle characteristics in the second direction, and thus wide viewing angles in the first and second directions can be achieved by the first grooves 9 and the second grooves 10.

For example, as illustrated in FIG. 1A and FIG. 2 to FIG. 6, inclination directions of the first groove 9 and the second groove 10 with respect to the first direction are opposite to each other. For example, the first groove 9 is inclined to the right with respect to the first signal line 1, and the second groove 10 is inclined to the left with respect to the first signal line 1. By making the first groove 9 and the second groove 10 have opposite inclination directions with respect to the same first signal line 1, it is advantageous to make the plane electric field formed at the first grooves and the second grooves more uniformly distributed in the first direction, and thereby it is beneficial to increasing the viewing angle uniformity in the first direction.

The embodiments illustrated in FIG. 1A and FIG. 2 to FIG. 6 are described by taking the example of the first direction as the horizontal direction and the second direction as the vertical direction. However, when the viewing angle changes, the first direction and the second direction also change accordingly.

Figure 5:
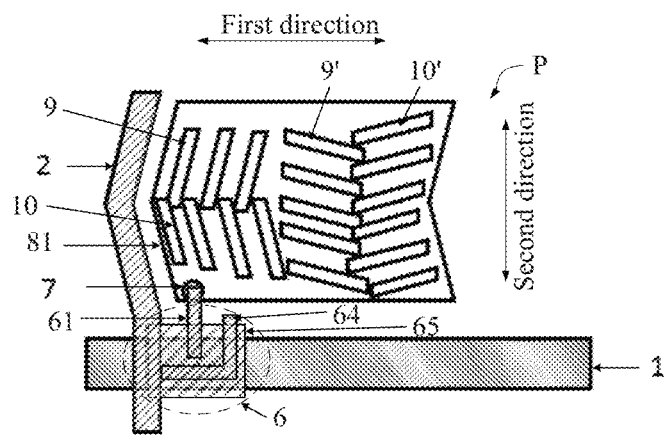
FIG. 5 is a schematic top view of the pixel structure provided by an embodiment of the present disclosure.

The first electrode 81 in the embodiments illustrated in FIGS. 1A, 2 to 4, and 6 includes two types of grooves. In other embodiments, the first electrode 81 includes more types of grooves. For example, as illustrated in FIG. 5, on the basis that the first electrode 81 includes the first grooves 9 and the second grooves 10, the first electrode 81 further includes a third groove group and a fourth groove group, the third groove group includes a plurality of hollow third grooves 9' arranged successively, and the fourth groove group includes a plurality of hollow fourth grooves 10' arranged successively; an arrangement direction of the third groove group and the fourth groove group intersects the arrangement direction of the first groove group and the second groove. Thus, it is possible to obtain better wide viewing angle characteristics simultaneously in different directions.

For example, the arrangement direction of the first groove group and the second groove group is perpendicular to the arrangement direction of the third groove group and the fourth groove group. For example, as illustrated in FIG. 5, the first groove group and the second groove group are arranged along the second direction, and the third groove group and the fourth groove group are arranged along the first direction. That is, on the basis that the first electrode 81 includes the first groove group having the first grooves 9 and the second groove group having the second grooves 10, the first electrode 81 further includes a plurality of hollow third grooves 9' successively arranged along the second direction and a plurality of hollow fourth grooves 10' successively arranged along the second direction; and the third groove group including the plurality of third grooves 9' and the fourth groove group including the plurality of fourth grooves 10' are arranged along the first direction. In the embodiment of the present disclosure, a better viewing angle characteristic in the first direction can be obtained by the first grooves 9 and the second grooves 10, and a better viewing angle characteristic in the second direction can be obtained by the third grooves 9' and the fourth grooves 10', so that the pixel structure has better wide viewing angle characteristics in both the first direction and the second direction.

For example, at least one fourth groove 10' is staggered in the second direction with respect to the third groove 9' adjacent to the at least one fourth groove 10'. For example, as illustrated in FIG. 5, each fourth groove 10' is staggered in the second direction with respect to the third groove 9' adjacent to the each fourth groove 10'. This can further improve the wide viewing angle characteristics.

For example, as illustrated in FIG. 1A and FIG. 2 to FIG. 6, a planar shape (that is, a shape of an orthographic projection on the base substrate carrying the first electrode 81) of each of the first groove 9 and the second groove 10 is a linear structure. In other embodiments of the present disclosure, the planar shape of each of the first groove and the second groove may be other structures.

For example, as illustrated in FIG. 1A and FIG. 2 to FIG. 6, each second groove 10 is staggered in the first direction with respect to the first groove 9 adjacent to the each second groove 10, and each first groove 9 is staggered in the first direction with respect to the second groove 10 adjacent to the each first groove 9. Embodiments of the present disclosure include, but are not limited to, the embodiments illustrated in FIG. 1A and FIG. 2 to FIG. 6. For example, in at least one embodiment, part of the plurality of second grooves 10 are respectively aligned with the first grooves 9 adjacent thereto rather than being staggered, as long as at least one second groove 10 is staggered in the first direction with respect to the first groove 9 adjacent to the at least one second groove 10, so that the plurality of second grooves 10 are non-axisymmetric with the plurality of first grooves 9.

For example, the pixel structure provided by any one of the above embodiments of the present disclosure adopts an ADS (advanced super dimension switch) mode, an FFS (fringe field switching) mode, an IPS (in-plane switching) mode or a VA (vertical alignment) mode.

For example, in the ADS, FFS and IPS modes, the electric fields that controls the deflection of the liquid crystal molecules are planar electric fields, in which case each of the first groove 9 and the second groove 10 is a closed groove surrounded by the non-hollowed portion (i.e., two ends that are included by the groove and arranged along the extending direction of the groove are adjacent to the non-hollow portion 8), as illustrated in FIGS. 1A and 2 to 5. This is advantageous for ensuring that the non-hollow portion has a large effective area, thereby ensuring that the liquid crystal display device has a large effective display area to increase the display effect.

For example, in the VA mode, the electric field that controls the deflection of the liquid crystal molecules is a vertical electric field, in which case each of the first groove 9 and the second groove 10 is a closed groove surrounded by the non-hollow portion, or a semi-closed groove (i.e. one end of the groove is adjacent to the non-hollow portion and the other end is non-closed).

For example, in the VA mode, as illustrated in FIG. 6, the first electrode 81 further includes a fifth groove 5 located between the first groove group and the second groove group in the arrangement direction (for example, the second direction) of the first groove group and the second groove group, and the fifth groove 5 opens into the second ends B of the plurality of first grooves 9 and opens into the third ends C of the plurality of second grooves 10. Thus, the first grooves 9 and the second grooves 10 are semi-closed grooves. In this way, it is possible to ensure that the non-hollow portion has a large working area, and it is advantageous to form the vertical electric field between the first electrode 81 and the second electrode 82, thereby obtaining a better display effect.

At least one embodiment of the present disclosure provides a manufacturing method of the pixel structure, and the method includes forming the first electrode so that the first electrode includes the first groove group, the second groove group, and the non-hollow portion adjacent to the first groove group and the second groove group; the first groove group includes the plurality of first grooves which are hollow and are successively arranged, each first groove includes the first end and the second end which are arranged along the extending direction of the each first groove, the first ends of the plurality of first grooves are on the first side of the first groove group, the second ends of the plurality of first grooves are on the second side of the first groove group, and the second side is opposite to the first side; the second groove group is on the second side of the first groove group and includes the plurality of second grooves which are hollow and are successively arranged, each second groove includes the third end and the fourth end which are arranged along the extending direction of the each second groove, and the third end is on the side of the fourth end close to the first groove group; and the third end of at least one of the plurality of second grooves is staggered with respect to the second end of the first groove adjacent to the third end of the at least one of the plurality of second grooves.

For example, the plurality of first grooves included by the first groove group are arranged along the first direction, the plurality of second grooves included by the second groove group are also arranged along the first direction, the first groove group and the second groove group are arranged along the second direction different from the first direction, and the third end of the at least one second groove is staggered in the first direction with respect to the second end of the first groove adjacent to the third end of the at least one second groove.

For example, the first electrode is formed by performing a patterning process on a conductive film. For example, the patterning process includes the steps of coating a photoresist on the conductive film, exposing and developing the photoresist, and then etching the conductive film by using the developed photoresist as a mask.

For example, the manufacturing method of the pixel structure further includes the steps of forming the first signal line and the second signal line that intersect each other, the second electrode, the transistor, and the insulating layers between the conductive members.

For the arrangement of each structure formed in the manufacturing method, reference may be made to the description in the above embodiments of the pixel structure, and repeated descriptions are omitted herein.

At least one embodiment of the present disclosure further provides an array substrate including the pixel structure provided according to any one of the above embodiments.

Figure 7:
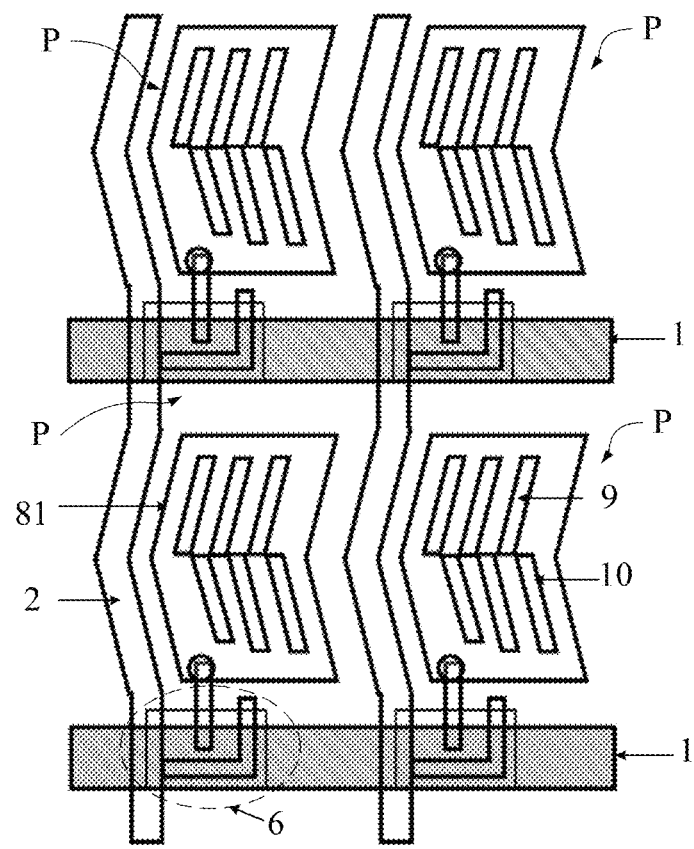
FIG. 7 is a schematic top view of an array substrate provided by an embodiment of the present disclosure.

For example, as illustrated in FIG. 7, the array substrate includes a plurality of pixel units P, and each pixel unit P is defined by intersection of adjacent first signal lines 1 and adjacent second signal lines 2; each pixel unit P is provided with one first electrode 81 therein; and first electrodes 81 of different pixel units P are respectively connected to different transistors 6.

For example, as illustrated in FIG. 7, the first grooves 9 and the second grooves 10 of the first electrodes 81 respectively in adjacent pixel units P are disposed in the same manner; in other embodiments, the first grooves 9 and the second grooves 10 of the first electrodes 81 respectively included by adjacent pixel units P are disposed in different manners.

At least one embodiment of the present disclosure further provides a display device, which includes the array substrate described in any one of the above embodiments.

For example, the display device is the liquid crystal display device. For example, the liquid crystal display device employs the ADS mode, the FFS mode, the IPS mode, or the VA mode.

For example, the display device may be any product or component having a display function such as a liquid crystal panel, an electronic paper, a mobile phone, a tablet computer, a television, a display, a notebook computer, a digital photo frame, a navigator, or the like.

In summary, in the pixel structure and the manufacturing method of the pixel structure, the array substrate and the display device provided by the embodiments of the present disclosure, the first grooves and the second grooves having intersected extending directions are disposed in the first electrode of the same pixel unit, and at least one second groove is staggered in the first direction with respect to the first groove adjacent to the at least one second groove, which causes the liquid crystal molecules in the liquid crystal display device to have more deflection angles, thereby improving the wide viewing angle characteristics of the liquid crystal display device.

It should be noted that the embodiments of the present disclosure and the features in the embodiments may be combined with each other without conflict.

What is described above is related to the illustrative embodiments of the disclosure only and not limitative to the scope of the disclosure; the scopes of the disclosure are defined by the accompanying claims.

What is claimed is:

1. A pixel structure, comprising:
    a first electrode, which comprises a first groove group, a second groove group and a non-hollow portion adjacent to both the first groove group and the second groove group, wherein:
    the first groove group comprises a plurality of first grooves which are hollow and are successively arranged, each first groove comprises a first end and a second end which are arranged along an extending direction of the first groove, first ends of the plurality of first grooves are on a first side of the first groove group, second ends of the plurality of first grooves are on a second side of the first groove group, and the second side and the first side are opposite to each other;
    the second groove group is on the second side of the first groove group and comprises a plurality of second grooves which are hollow and are successively arranged, each second groove comprises a third end and a fourth end which are arranged along an extending direction of the second groove, and the third end is on a side of the fourth end close to the first groove group; and
    the third end of at least one of the plurality of second grooves is staggered with respect to the second end of the first groove which is adjacent to the third end of the at least one of the plurality of second grooves;
    for the first groove and the second groove which are adjacent to each other, the second end of the first groove is between the third end and the fourth end of the second groove in an arrangement direction of the first groove group and the second groove group.

2. A pixel structure, comprising:
    a first electrode, which comprises a first groove group, a second groove group and a non-hollow portion adjacent to both the first groove group and the second groove group, wherein:
    the first groove group comprises a plurality of first grooves which are hollow and are successively arranged, each first groove comprises a first end and a second end which are arranged along an extending direction of the first groove, first ends of the plurality of first grooves are on a first side of the first groove group, second ends of the plurality of first grooves are on a second side of the first groove group, and the second side and the first side are opposite to each other;

the second groove group is on the second side of the first groove group and comprises a plurality of second grooves which are hollow and are successively arranged, each second groove comprises a third end and a fourth end which are arranged along an extending direction of the second groove, and the third end is on a side of the fourth end close to the first groove group; and the third end of at least one of the plurality of second grooves is staggered with respect to the second end of the first groove which is adjacent to the third end of the at least one of the plurality of second grooves;

a number of the plurality of first grooves is not equal to a number of the plurality of second grooves.

3. The pixel structure according to claim 2, further comprising a second electrode, wherein the second electrode and the first electrode are in different layers, one of the first electrode and the second electrode is a pixel electrode, and the other of the first electrode and the second electrode is a common electrode.

4. The pixel structure according to claim 2, further comprising:
a first signal line extending in a first direction;
a second signal line extending in a second direction and intersecting the first signal line,
wherein one of the first signal line and the second signal line is a gate line and the other of the first signal line and the second signal line is a data line.

5. The pixel structure according to claim 4, wherein the second end of the first groove is directed to the first end of the first groove along a third direction, and the third end of the second groove is directed to the fourth end of the second groove along a fourth direction;
a first inclination angle of the third direction with respect to the first direction in the clockwise direction and a second inclination angle of the fourth direction with respect to the first direction in a counterclockwise direction are both acute angles, or both obtuse angles.

6. The pixel structure according to claim 4, further comprising:
a transistor which is at an intersection of the first signal line and the second signal line and is electrically connected with the first electrode,
wherein the second groove group is between the first groove group and the first signal line, and the second groove, which is closest to the transistor, of the plurality of second grooves has a smallest extension length among extension lengths of the plurality of second grooves.

7. The pixel structure according to claim 6, wherein the plurality of second grooves are staggered with respect to the plurality of first grooves in the first direction and away from the transistor.

8. The pixel structure according to claim 4, wherein the first electrode comprises a first edge and a second edge which are intersected with each other, the first edge is parallel to the first groove, and the second edge is parallel to the second groove.

9. The pixel structure according to claim 8, wherein the second signal line comprises a first extension portion and a second extension portion which are intersected with each other and arranged along the second direction, the first extension portion is parallel to the first edge, and the second extension portion is parallel to the second edge.

10. The pixel structure according to claim 2, wherein the non-hollow portion comprises first extension portions which are strip-shaped and respectively located between the plurality of first grooves, and further comprises second extension portions which are strip-shaped and respectively located between the plurality of second grooves, each first extension portion corresponds to one second groove and each second extension portion corresponds to one first groove.

11. The pixel structure according to claim 10, wherein an extension length of each first extension portion is less than or equal to an extension length of the first groove adjacent to the first extension portion, and an extension length of each second extension portion is less than or equal to an extension length of the second groove adjacent to the second extension portion.

12. The pixel structure according to claim 10, wherein a width of the first extension portion is substantially equal to a width of the second extension portion.

13. The pixel structure according to claim 2, wherein:
the first electrode further comprises a third groove group and a fourth groove group, the third groove group comprises a plurality of third grooves which are hollow and are successively arranged, and the fourth groove group comprises a plurality of fourth grooves which are hollow and are successively arranged;
an arrangement direction of the third groove group and the fourth groove group intersects an arrangement direction of the first groove group and the second groove group.

14. The pixel structure according to claim 2, wherein:
each of the first groove and the second groove is a closed groove surrounded by the non-hollowed portion; or
the first electrode further comprises a fifth groove which is between the first groove group and the second groove group in an arrangement direction of the first groove group and the second groove group, and the fifth groove opens into the second end of the first groove and opens into the third end of the second groove.

15. An array substrate, comprising the pixel structure according to claim 2.

16. A display device, comprising the array substrate according to claim 15.

17. The pixel structure according to claim 4, wherein a first acute angle is between the first groove and the first signal line, a second acute angle is between the second groove and the first signal line, and the first acute angle is equal to the second acute angle.

18. The pixel structure according to claim 2, wherein the plurality of first grooves and the plurality of second grooves are alternately arranged.

19. A pixel structure, comprising:
a first electrode, which comprises a first groove group, a second groove group and a non-hollow portion adjacent to both the first groove group and the second groove group, wherein:
the first groove group comprises a plurality of first grooves which are hollow and are successively arranged, each first groove comprises a first end and a second end which are arranged along an extending direction of the first groove, first ends of the plurality of first grooves are on a first side of the first groove group, second ends of the plurality of first grooves are on a second side of the first groove group, and the second side and the first side are opposite to each other;
the second groove group is on the second side of the first groove group and comprises a plurality of second grooves which are hollow and are successively arranged, each second groove comprises a third end and a fourth end which are arranged along an extending direction of the second groove, and the third end is on a side of the fourth end close to the first groove group; and the third end of at least one of the plurality of second grooves is staggered with respect to the second end of the first groove which is adjacent to the third end of the at least one of the plurality of second grooves;

the pixel structure further comprises a first signal line extending in a first direction and a second signal line extending in a second direction and intersecting the first signal line, and one of the first signal line and the second signal line is a gate line and the other of the first signal line and the second signal line is a data line;

a first acute angle is between the first groove and the first signal line, a second acute angle is between the second groove and the first signal line, and the first acute angle is not equal to the second acute angle.

* * * * *